(12) United States Patent
Rofougaran et al.

(10) Patent No.: US 8,666,340 B2
(45) Date of Patent: Mar. 4, 2014

(54) METHOD AND SYSTEM FOR ON-CHIP IMPEDANCE CONTROL TO IMPEDANCE MATCH A CONFIGURABLE FRONT END

(75) Inventors: Ahmadreza Rofougaran, Newport Coast, CA (US); Maryam Rofougaran, Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 682 days.

(21) Appl. No.: 12/397,040

(22) Filed: Mar. 3, 2009

(65) Prior Publication Data
US 2010/0225400 A1 Sep. 9, 2010

(51) Int. Cl.
*H01Q 11/12* (2006.01)
(52) U.S. Cl.
USPC .......................... 455/127.3; 330/195
(58) Field of Classification Search
None
See application file for complete search history.

(56) References Cited

U.S. PATENT DOCUMENTS

| | | | | |
|---|---|---|---|---|
| 5,264,810 | A * | 11/1993 | Sager et al. | 333/131 |
| 5,532,887 | A * | 7/1996 | Higashiyama et al. | 360/64 |
| 6,236,284 | B1 * | 5/2001 | Duello et al. | 332/149 |
| 6,294,955 | B1 * | 9/2001 | Luu et al. | 330/51 |
| 6,707,367 | B2 * | 3/2004 | Castaneda et al. | 336/200 |
| 6,731,166 | B1 * | 5/2004 | Sabouri et al. | 330/124 R |
| 6,756,925 | B1 * | 6/2004 | Leung et al. | 341/133 |
| 6,870,513 | B2 * | 3/2005 | Deng et al. | 343/795 |
| 6,996,379 | B2 * | 2/2006 | Khorram | 455/91 |
| 7,068,104 | B2 * | 6/2006 | Burns et al. | 330/253 |
| 7,088,214 | B2 * | 8/2006 | Castaneda et al. | 336/200 |
| 7,129,803 | B2 * | 10/2006 | Khorram et al. | 333/25 |
| 7,184,735 | B2 * | 2/2007 | Bhatti et al. | 455/292 |
| 7,242,245 | B2 * | 7/2007 | Burns et al. | 330/124 R |
| 7,330,076 | B2 * | 2/2008 | Komijani et al. | 330/276 |
| 7,365,602 | B2 * | 4/2008 | Bhatti et al. | 330/295 |
| 7,369,096 | B2 * | 5/2008 | Castaneda et al. | 343/859 |
| 7,471,153 | B2 * | 12/2008 | Kee et al. | 330/295 |
| 7,486,141 | B2 * | 2/2009 | Do et al. | 330/276 |
| 7,675,365 | B2 * | 3/2010 | Lee et al. | 330/295 |
| 7,728,661 | B2 * | 6/2010 | Bockelman et al. | 330/51 |
| 7,746,174 | B2 * | 6/2010 | Yang et al. | 330/295 |
| 7,777,570 | B2 * | 8/2010 | Lai | 330/276 |
| 7,872,528 | B2 * | 1/2011 | Bockelman et al. | 330/149 |
| 7,880,547 | B2 * | 2/2011 | Lee et al. | 330/295 |
| 7,936,215 | B2 * | 5/2011 | Lee et al. | 330/195 |
| 7,991,375 | B2 * | 8/2011 | Afsahi | 455/320 |
| 2007/0046371 | A1 * | 3/2007 | Barabash et al. | 330/195 |

(Continued)

OTHER PUBLICATIONS

Impedance Matching: A Primer, 2001, Jaycar Electronics.*

*Primary Examiner* — Thomas J Hiltunen
(74) *Attorney, Agent, or Firm* — Farjami & Farjami LLP

(57) ABSTRACT

Methods and systems for on-chip impedance control to impedance match a configurable front end are disclosed and may include selectively enabling one or more amplifiers coupled to taps on a multi-tap transformer in a chip including the amplifiers. The impedances of the amplifiers may be matched to impedances of the taps on the transformer. The amplifiers may include low noise amplifiers wherein the input impedance of each of the low noise amplifiers may be different. The amplifiers may include power amplifiers wherein an output impedance of each of the power amplifiers may be different. The transformer may be coupled to an on-chip antenna, or to an antenna integrated on a package coupled to the chip. The multi-tap transformer may be integrated on the package. RF signals may be communicated via the selectively enabled amplifiers and the multi-tap transformer. The multi-tap transformer may include ferromagnetic materials integrated in the chip.

16 Claims, 7 Drawing Sheets

(56) References Cited

U.S. PATENT DOCUMENTS

| | | | |
|---|---|---|---|
| 2008/0113682 A1* | 5/2008 | Park et al. | 455/552.1 |
| 2008/0139158 A1* | 6/2008 | Chang et al. | 455/311 |
| 2009/0258617 A1* | 10/2009 | Yoshihara | 455/127.1 |
| 2009/0289721 A1* | 11/2009 | Rajendran et al. | 330/301 |
| 2010/0019857 A1* | 1/2010 | McMorrow et al. | 333/32 |
| 2010/0019858 A1* | 1/2010 | McMorrow et al. | 333/32 |
| 2010/0148869 A1* | 6/2010 | Kawakami et al. | 330/255 |
| 2010/0194493 A1* | 8/2010 | Thompson | 333/132 |
| 2010/0231305 A1* | 9/2010 | Mizokami et al. | 330/310 |
| 2010/0270999 A1* | 10/2010 | Lai | 323/361 |
| 2011/0128088 A1* | 6/2011 | Jin et al. | 333/25 |
| 2011/0248782 A1* | 10/2011 | Kondo et al. | 330/269 |

* cited by examiner

METHOD AND SYSTEM FOR ON-CHIP IMPEDANCE CONTROL TO IMPEDANCE MATCH A CONFIGURABLE FRONT END

CROSS-REFERENCE TO RELATED APPLICATIONS/INCORPORATION BY REFERENCE

This application makes reference to:
U.S. patent application Ser. No. 12/367,892 filed on Feb. 9, 2009;
U.S. patent application Ser. No. 12/396,936 filed on even date herewith;
U.S. patent application Ser. No. 12/396,964 filed on even date herewith;
U.S. patent application Ser. No. 12/397,005 filed on even date herewith;
U.S. patent application Ser. No. 12/397,024 filed on even date herewith;
U.S. patent application Ser. No. 12/397,060 filed on even date herewith; and
U.S. patent application Ser. No. 12/397,096 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for on-chip impedance control to impedance match a configurable front end.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for on-chip impedance control to impedance match a configurable front end, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for on-chip impedance control to impedance match a configurable front end. Exemplary aspects of the invention may comprise selectively enabling one or more amplifiers coupled to one or more taps on a multi-tap transformer in a chip comprising the amplifiers. The impedances of the amplifiers may be matched to impedances of the taps on the transformer. The amplifiers may comprise low noise amplifiers wherein an input impedance of one or more of the low noise amplifiers may be different. The amplifiers may comprise power amplifiers wherein an output impedance of one or more of the power amplifiers may be different. The transformer may be coupled to an on-chip antenna, or to an antenna integrated on a package coupled to or bonded to the chip. The multi-tap transformer may be integrated on the package. RF signals may be communicated via the selectively enabled amplifiers and the multi-tap transformer. The multi-tap transformer may comprise ferromagnetic materials integrated in the chip.

Figure 1:
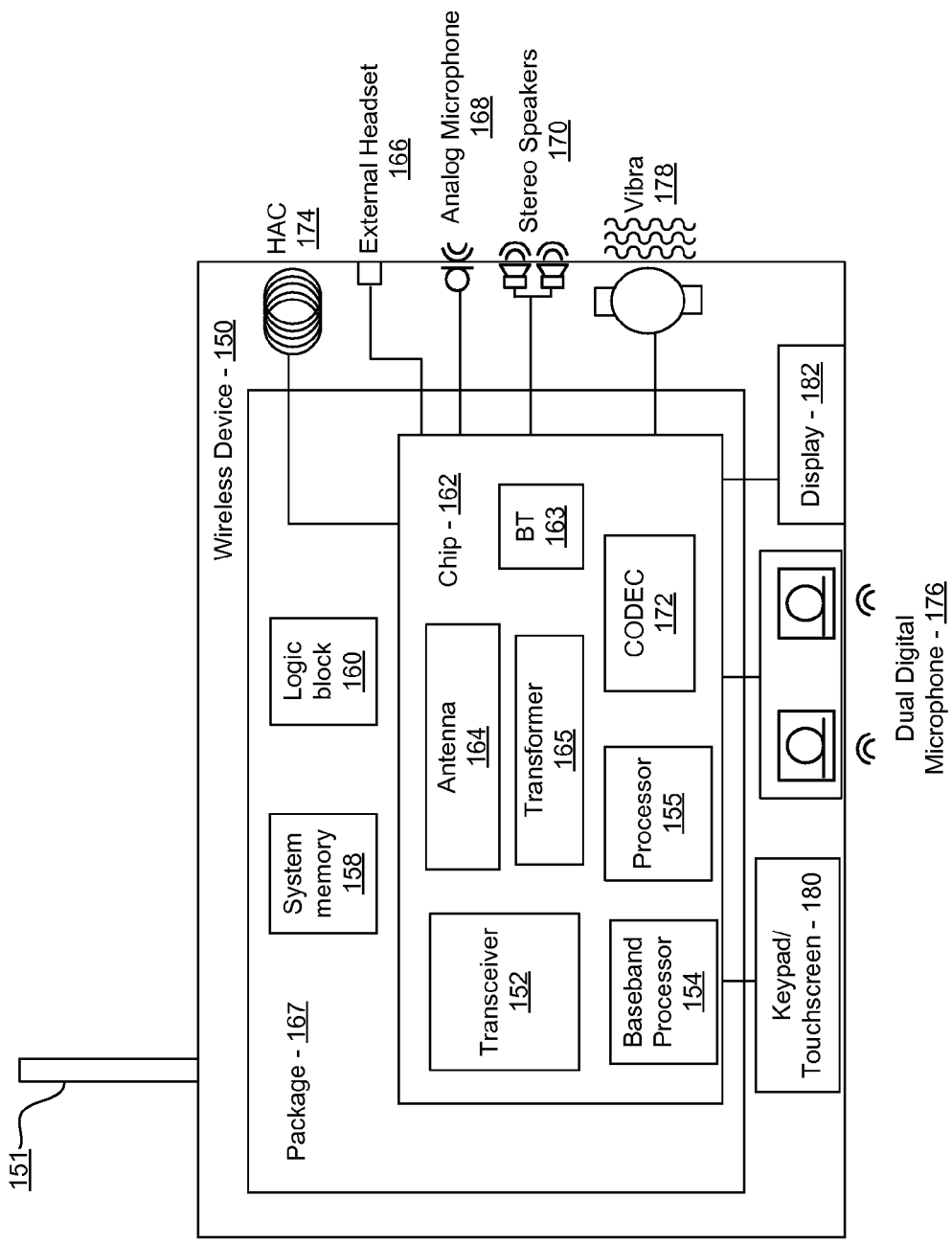
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, an on-chip antenna 164, a transformer 165, an external headset port 166, and a package 167. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the on-chip antenna 164. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZIGBEE, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma (Δ-Σ) modulator, for example, to code digital output signals for analog processing.

The chip 162 may comprise an integrated circuit with multiple functional blocks integrated within, such as the transceiver 152, the processor 156, the baseband processor 154, the BT radio/processor 163, the transformer 165, the CODEC 172, and the on-chip antenna 164. The number of functional blocks integrated in the chip 162 is not limited to the number shown in FIG. 1. Accordingly, any number of blocks may be integrated on the chip 162 depending on chip space and wireless device 150 requirements, for example.

The transformer 165 may comprise a multi-winding primary transformer with a plurality of primary and/or secondary taps. Accordingly, the impedance of the taps may be different, with higher winding taps comprising higher impedances. Thus amplifiers, such as PAs and LNAs, may be coupled to appropriate taps on the transformer 165 for proper impedance matching and increased signal coupling efficiency at a plurality of power/gain levels.

The on-chip antenna 164 may comprise a microstrip antenna, for example integrated on the chip 162, and may be operable to transmit and receive RF signals. In another embodiment of the invention, the on-chip antenna 164 may be integrated on the package 167, depending on size requirements.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The package 167 may comprise a printed circuit board or other support structure for the chip 162 and other components of the wireless device 150. The package 167 may comprise insulating and conducting material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The wireless signals may be transmitted and received by the on-chip antenna 164. Power amplifiers and low noise amplifiers may be coupled to the on-chip antenna 164 via taps on the multi-tap transformer 165 with similar impedance to that of the particular amplifier being coupled. Accordingly, high power, low impedance PAs or low gain, low impedance LNAs may be coupled to low impedance taps comprising fewer turns of the multi-tap transformer 165, for example, and low power, high impedance PAs or high gain, high impedance LNAs may be coupled to higher impedance taps comprising more turns. In this manner, impedance matching with PAs and LNAs with different output and input impedances, respectively, may be enabled.

Figure 2A:
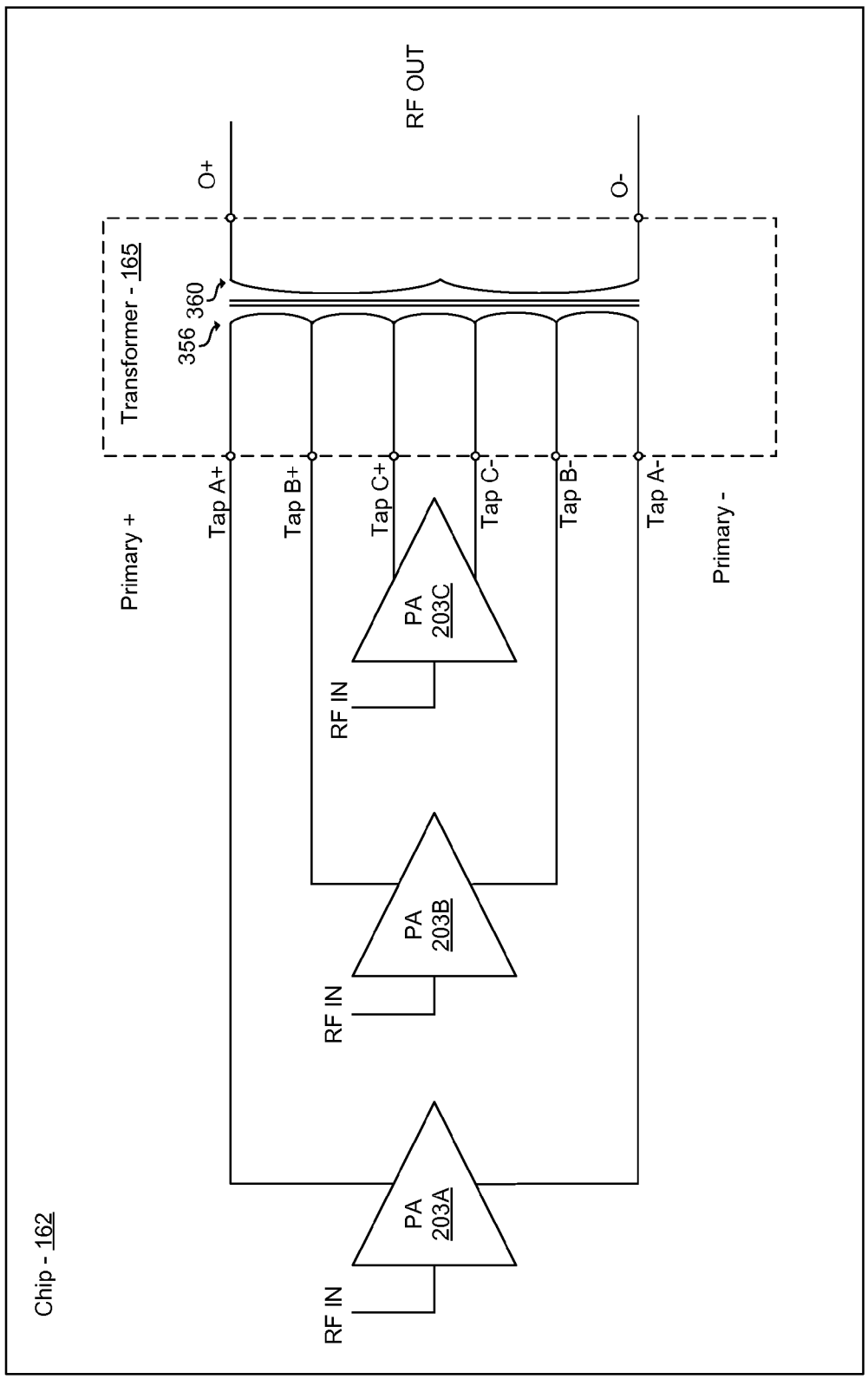
FIG. 2A is a block diagram illustrating exemplary power amplifiers and a multi-tap transformer, in accordance with an embodiment of the invention.

FIG. 2A is a block diagram illustrating exemplary power amplifiers and a multi-tap transformer, in accordance with an embodiment of the invention. Referring to FIG. 2A, there is shown PAs 203A-203C, and the multi-tap transformer 165 comprising primary taps A+, A−, B+, B−, C+, and C−, and secondary taps O+ and O−.

The PAs 203A-203C may comprise suitable circuitry, logic, interface(s), and/or code that may be operable to amplify received signals to be communicated to an antenna via the multi-tap transformer 165. The PAs 203A-203C may be configured for optimum performance at different output power levels and may each have different output impedances. For example, the PA 203A may comprise a lower power amplifier with higher output impedance than the PAs 203B and 203C. The PA 203C may comprise a higher power, lower output impedance amplifier than the PAs 203A and 203B.

Optimum coupling efficiency between a PA and a transformer may be obtained when the output impedance matches that of the transformer tap coupled to the PA. Accordingly, the PA 203A may be coupled to higher impedance taps with more turns in the transformer, such as the taps A+ and A− of the transformer 165. Similarly, the PA 203C may be coupled to a lower impedance tap with fewer turns, such as the taps C+ and C− of the multi-tap transformer 165. The number of PAs and transformer taps is not limited to the number shown in FIG. 2. Accordingly, any number of PAs and taps may be incorporated depending on power and space requirements for both the PAs and the multi-tap transformer 165 on the chip 162 and/or the package 167. Similarly, the multi-tap transformer 165 may be utilized to couple LNAs to an antenna, with high input impedance LNAs coupled to higher turn taps and lower input impedance LNA coupled to lower turn taps of the multi-tap transformer 165.

In operation, RF signals generated by the processor 155 and/or the baseband processor 154 in the wireless device 150 may be communicated to the PAs 203A-203C. In an embodiment of the invention, the PAs 203A-203C may be selectively enabled to amplify the received RF input signals and communicate the amplified signals to the multi-tap transformer 165 via the taps A+, A−, B+, B−, C+, and C−, depending on which of the PAs 203A-203C is enabled.

Figure 2B:
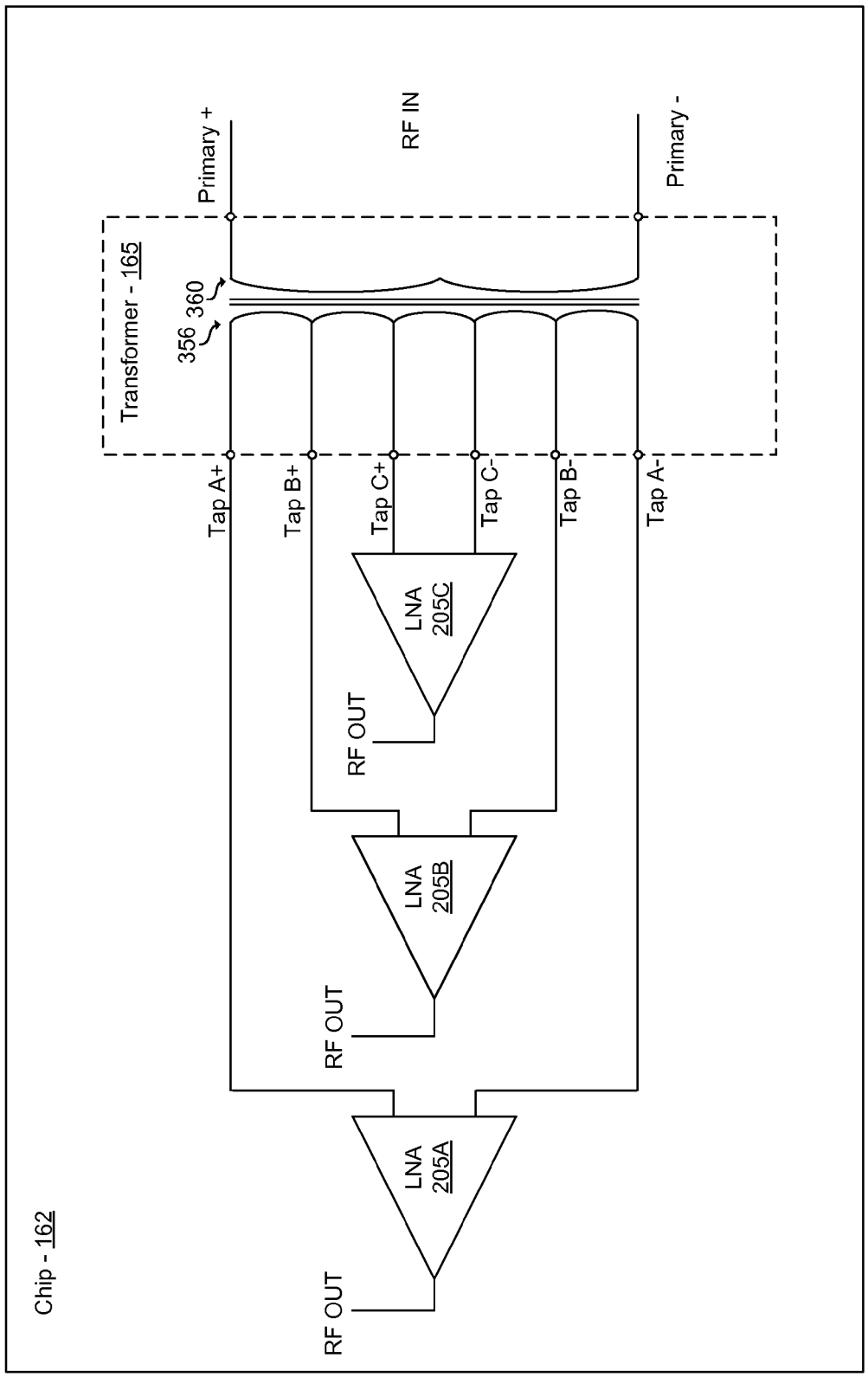
FIG. 2B is a block diagram illustrating exemplary low noise amplifiers and a multi-tap transformer, in accordance with an embodiment of the invention.

FIG. 2B is a block diagram illustrating exemplary low noise amplifiers and a multi-tap transformer, in accordance with an embodiment of the invention. Referring to FIG. 2A, there is shown LNAs 205A-205C, and the multi-tap transformer 165 comprising secondary taps A+, A−, B+, B−, C+, and C−, and primary taps O+ and O−.

The LNAs 205A-205C may comprise suitable circuitry, logic, and/or code that may be operable to amplify signals received from an antenna via the multi-tap transformer 165. The LNAs 205A-205C may be configured for optimum performance at different gain levels and may each have different input impedances. For example, the LNA 205A may comprise a higher gain amplifier with higher input impedance than the LNAs 205B and 205C. The LNA 205C may comprise a lower gain, lower input impedance amplifier than the LNAs 205A and 205B.

Optimum coupling efficiency between an LNA and a transformer may be obtained when the input impedance matches that of the transformer tap coupled to the LNA. Accordingly, the LNA 205A may be coupled to higher impedance taps with more turns in the transformer, such as the taps A+ and A− of the multi-tap transformer 165. Similarly, the LNA 205C may be coupled to a lower impedance tap with fewer turns, such as the taps C+ and C− of the multi-tap transformer 165. The number of LNAs and transformer taps is not limited to the number shown in FIG. 2B. Accordingly, any number of LNAs and taps may be incorporated depending on gain and space requirements for both the LNAs and the multi-tap transformer 165 on the chip 162 and/or the package 167.

In operation, RF signals received by an antenna, such as the on-chip antenna 164 may be communicated to the LNAs 205A-205C by the multi-tap transformer 165 via the taps A+, A−, B+, B−, C+, and C−, depending on which of the LNAs 205A-205C is enabled for the desired gain level. In an embodiment of the invention, the LNAs 205A-205C may be selectively enabled to amplify the received RF signals and communicate the amplified signals to a processor such as the processor 155 and/or the baseband processor 154 in the wireless device 150.

Figure 3A:
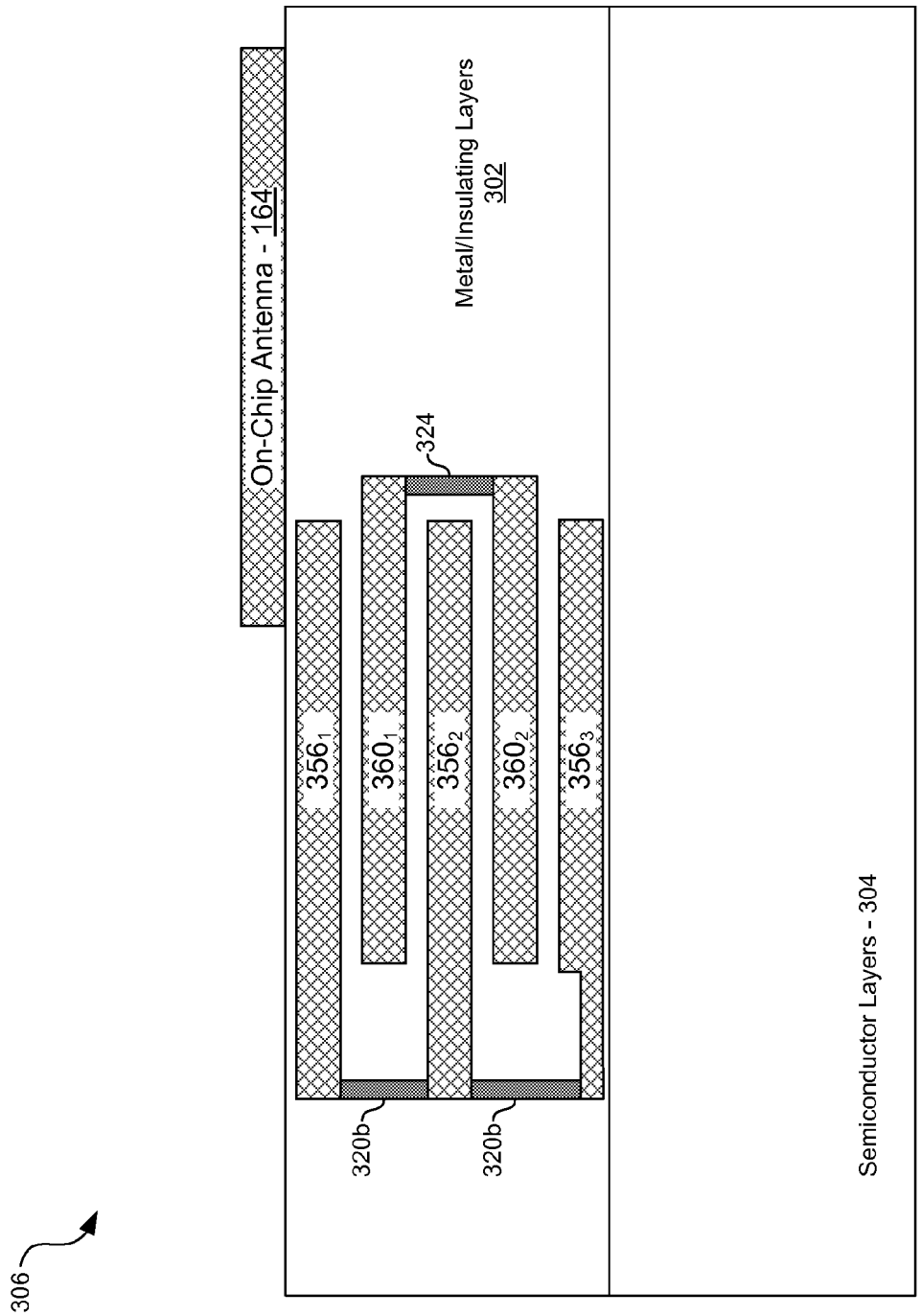
FIG. 3A is a diagram illustrating a cross sectional view of an integrated circuit comprising a transformer, in accordance with an embodiment of the invention.

FIG. 3A is a diagram illustrating a cross sectional view of an integrated circuit comprising a transformer, in accordance with an embodiment of the invention. Referring to FIG. 3A, there is shown an integrated circuit (IC) 306 comprising insulating, semiconducting, and conductive material with integrated electronics such as CMOS circuitry, the on-chip antenna 164, metal/insulating layers 302, semiconductor layers 304, and vias 320b and 324. Additionally, in various embodiments of the invention, the IC 306 may comprise one or more layers and/or areas of ferromagnetic and/or ferrimagnetic material.

The IC 306 may be substantially similar to the chip 162 described with respect to FIG. 1. Additionally, the IC 306 may be bump-bonded or flip-chip bonded to a multi-layer IC package (not shown). In this manner, wire bonds connecting the IC 306 to the multi-layer IC package may be eliminated, reducing and/or eliminating uncontrollable stray inductances due to wire bonds. In addition, the thermal conductance out of the IC 306 may be greatly improved utilizing solder balls (not shown) and thermal epoxy (not shown). The thermal epoxy may be electrically insulating but thermally conductive to allow for thermal energy to be conducted out of the IC 306 to the much larger thermal mass of a multi-layer package.

Figure 3B:
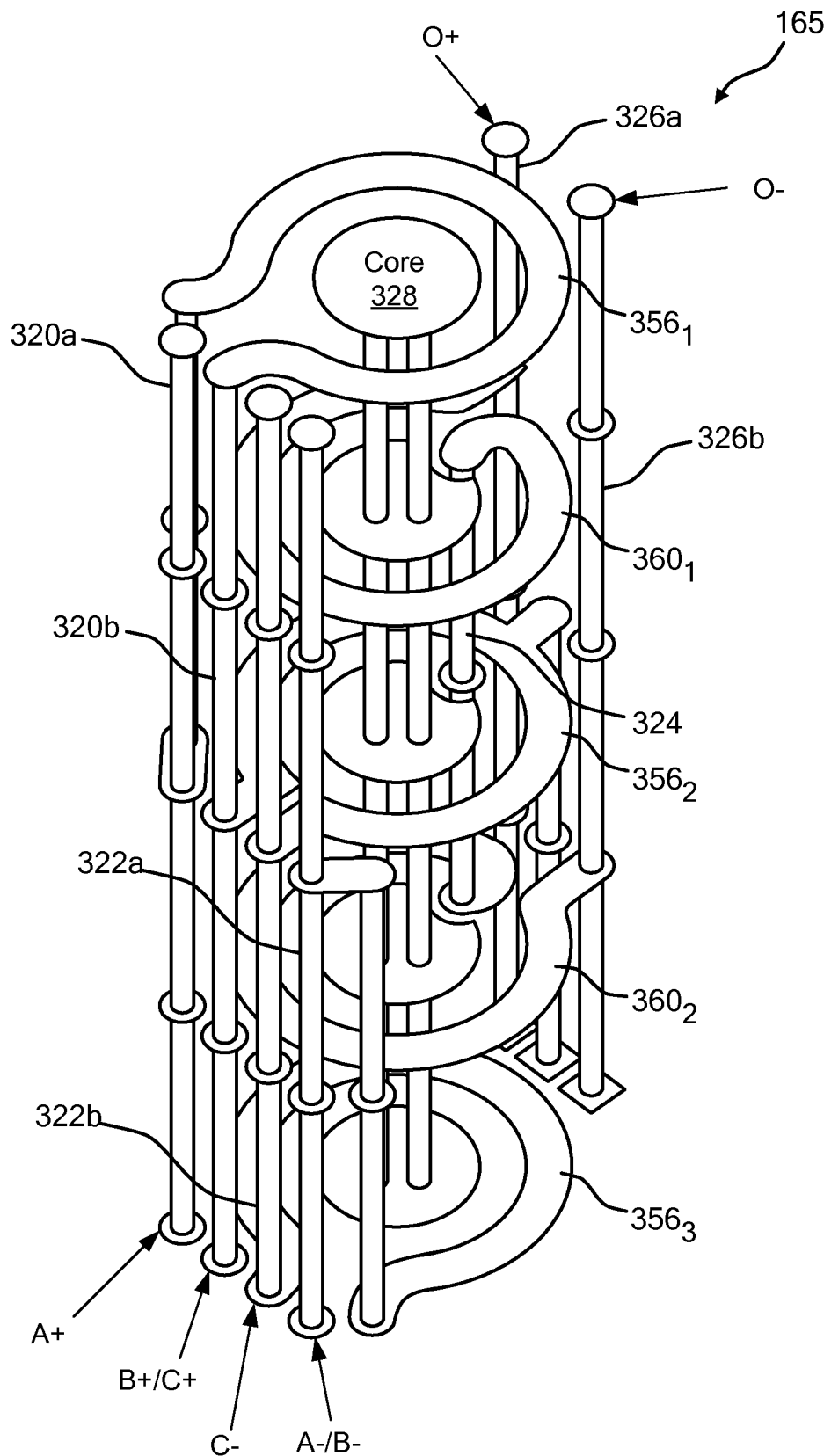
FIG. 3B is an exemplary three dimensional view of an integrated circuit multi-tap transformer, in accordance with an embodiment of the invention.

In an exemplary embodiment of the invention, the metal layers 302, may each comprise a deposited metal layer utilized to delineate the two transformer windings 356 (comprised of loops $356_1$, $356_2$, and $356_3$) and 360 (comprised of loops $360_1$, $360_2$) also as shown in FIG. 3B. In this regard, the metal layers 302 may be deposited in shapes and/or sizes which enable varying characteristics of the transformer 165.

In an exemplary embodiment of the invention, the vias 320b and 324 may comprise metal and/or other conductive material(s) which may communicatively couple the metal/insulating layers 302 to one another and/or to other logic and/or circuitry in the IC 306. The vias 320b and 324 along with other vias shown in FIG. 3B enable signals to be conveyed to and/or from the transformer windings 356 and 360.

In operation, the IC 306 may transmit and/or receive RF signals. The IC 306 may be electrically coupled to the antenna 151 and/or the on-chip antenna 164 via the transformer within the IC 306. The windings ratio of the transformer 165 may be utilized to determine the type of amplifier that may be coupled to each tap, such as the LNAs 205A-205C or the PAs 203A-203C, described with respect to FIGS. 2A and 2B. For example, a high power PA may require a low impedance tap, thus fewer windings of the transformer 165, such as the PA 203C. Similarly, a lower power PA may couple signals most efficiently with a higher impedance tap, such as the taps A+ and A− for the PA 203A.

In various embodiments of the invention, additional devices (e.g., transistors, capacitors, inductors, resistors) may be integrated into the IC 306 without deviating from the scope of the present invention. Additionally, although a transformer comprising five loops is depicted, various embodiments of the invention may comprise any number of metal layers, transformer loops, switching elements, etc. without deviating from the scope of the invention.

FIG. 3B is an exemplary three dimensional view of an integrated circuit multi-tap transformer, in accordance with an embodiment of the invention. Referring to FIG. 3B, there is shown a 3-D view of an embedded transformer similar to or the same as the multi-tap transformer 165 described with respect to FIGS. 1, 2A, 2B, and 3A. In the exemplary embodiment of the invention depicted, primary windings of FIG. 2A may be represented by loops $356_1$, $356_2$, and $356_3$ and the output windings of FIG. 2A may be represented by loops $360_1$ and $360_2$. Although the primary windings may show three turns, FIG. 3B demonstrates an exemplary configuration for one, two, and three turn winding tap connections. Accordingly, an exemplary embodiment of the taps A+, A−, B+, B−, C+, and C− of FIG. 2A are labeled in FIG. 3B. The vias 320a, 320b, 322a, and 322b may communicatively couple the loops $356_1$, $356_2$, and $356_3$ and the vias 324, 326a, and 326b may couple the loops $360_1$ and $360_2$.

Figure 4:
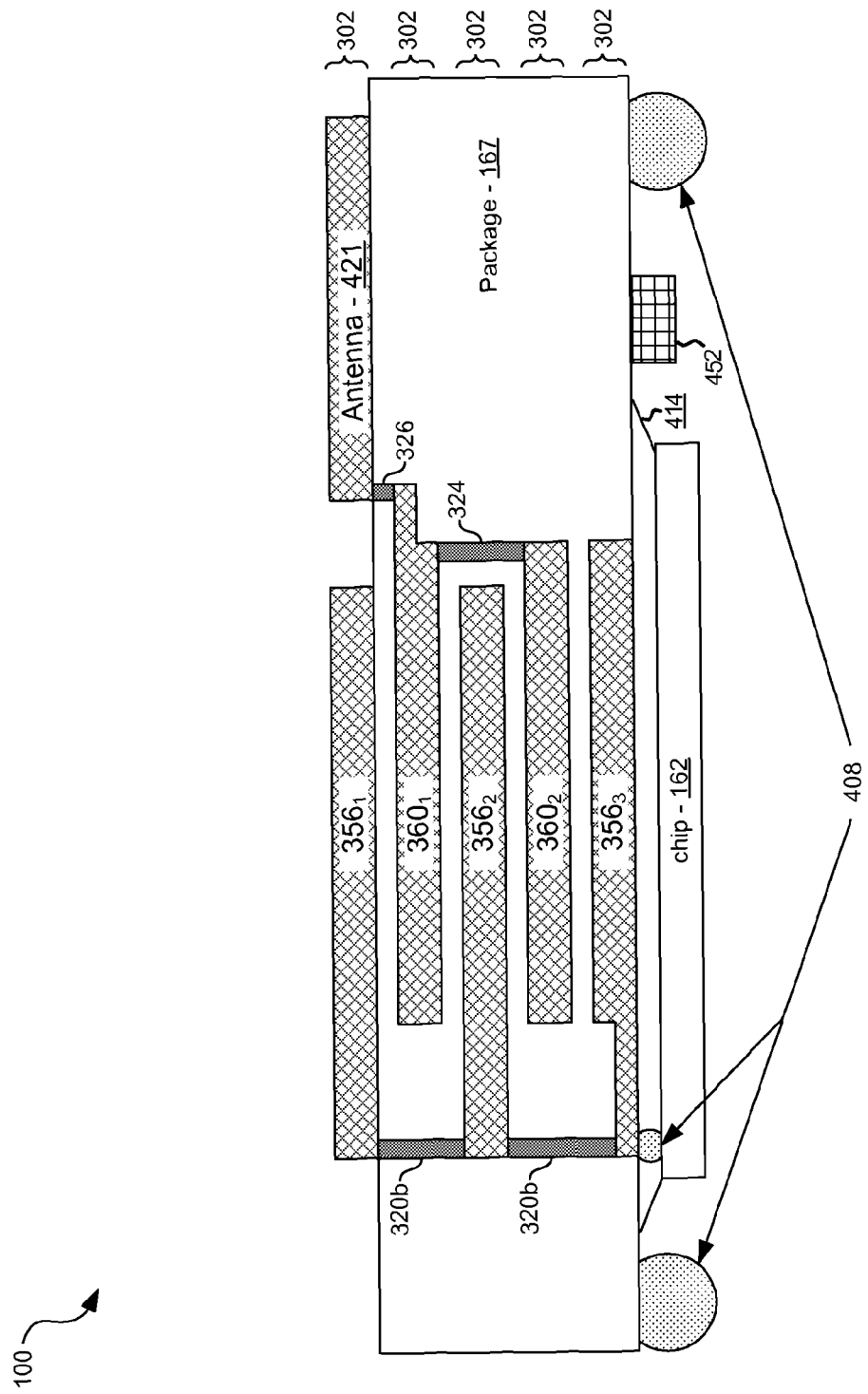
FIG. 4 is a diagram illustrating a cross sectional view of a multi-layer package with embedded transformer, in accordance with an embodiment of the invention.

FIG. 4 is a diagram illustrating a cross sectional view of a multi-layer package with embedded transformer, in accordance with an embodiment of the invention. Referring to FIG. 4, there is shown a hybrid circuit 100 comprising a chip 162 and a package 164. The package 167 may comprise insulating material, the metal layers 302, and the vias 320b, 324, and 326. Additionally, in various embodiments of the invention, the package 167 may comprise one or more layers and/or areas of ferromagnetic and/or ferrimagnetic material. The chip 162 may be coupled to the package 167, and the package 167 to a PCB (not shown), via solder balls 408. A surface mount component 452 may be mounted to the package 167, and thermal epoxy 414 may be pressed between the chip 162 and the package 167.

The chip 162 may be as described with respect to FIGS. 1, 2A, and 2B. Additionally, the chip 162 may be bump-bonded or flip-chip bonded to the package 167 utilizing solder balls (e.g. solder balls 408). In this manner, wire bonds connecting the chip 162 to the package 167 may be eliminated, reducing and/or eliminating uncontrollable stray inductances due to wire bonds. In addition, the thermal conductance out of the chip 162 may be greatly improved utilizing the solder balls 408 and the thermal epoxy 414. The thermal epoxy 414 may be electrically insulating but thermally conductive to allow for thermal energy to be conducted out of the chip 162 to the much larger thermal mass of the package 167.

The solder balls 408 may comprise metallic spherical balls to provide electrical, thermal and physical contact between the chip 162 and the package 167. In making the contact with the solder balls 408, the chip 162 may be pressed with enough force to squash the metal spheres somewhat, and may be performed at an elevated temperature to provide suitable electrical resistance and physical bond strength. The solder balls 408 may also be utilized to provide electrical, thermal and physical contact between the package 167 and a printed circuit board comprising other parts of, for example, the wireless device 150 described with respect to FIG. 1.

The surface mount device 452 may comprise discrete circuit elements such as resistors, capacitors, inductors, and diodes, for example. The surface mount device 452 may be soldered to the package 167 to provide electrical contact. In various embodiments of the invention, additional surface mount elements or no surface mount elements may be coupled to the package 167.

In an exemplary embodiment of the invention, the metal layers 302, may each comprise a deposited metal layer utilized to delineate the transformer windings 356 which comprises the loops $356_1$, $356_2$, and $356_3$ and 360 which comprises the loops $360_1$, $360_2$ which are described with respect to, for example, FIGS. 2, 3A, and 3B, and the on-package antenna 421. In this regard, the metal layers 302 may be deposited in shapes and/or sizes which enable varying characteristics of the multi-tap transformer 156 and the on-package antenna 421.

In an exemplary embodiment of the invention, the vias 320b, 324, and 326 may comprise metal and/or other conductive material(s) which may communicatively couple the metal layers 302 to one another and to the solder balls 408. In this manner, signals may be conveyed to and/or from the transformer windings 356 and 360, the chip 162, and the on-package antenna 421. In the exemplary embodiment of the invention depicted, the vias may be configured as shown in FIG. 3B to couple the windings of the transformer comprising the loops 356 and 360.

In operation, the chip 162 and associated package 167 may be utilized to transmit and/or receive RF signals. The chip 162 may be electrically coupled to the on-package antenna 421 embedded on and/or within the package 167 via a transformer embedded on and/or within the package 167. The windings ratio of the transformer may be utilized to determine the impedances at the plurality of taps and may be utilized to impedance match amplifiers to the transformer, as described, for example, with respect to FIGS. 2A and 2B.

In an embodiment of the invention, the gain of the LNAs 205A-205C and/or the output power of the PAs 203A-203C may be dynamically configured to adjust to changing conditions such as received signal strength or channel conditions, for example. In addition, the enabled LNA of the LNAs 205A-205C and/or the enabled PA of the PAs 203A-203C may be disabled and another PA and/or LNA may be enabled to increase/decrease gain and/or output power as needed.

In various embodiments of the invention, additional devices (e.g., capacitors, inductors, resistors) may be integrated into the package 167 without deviating from the scope of the present invention. Additionally, although a transformer comprising five loops is depicted, various exemplary embodiments of the invention may comprise any number of metal layers, transformer loops, switching elements, without deviating from the scope of the invention.

Figure 5:
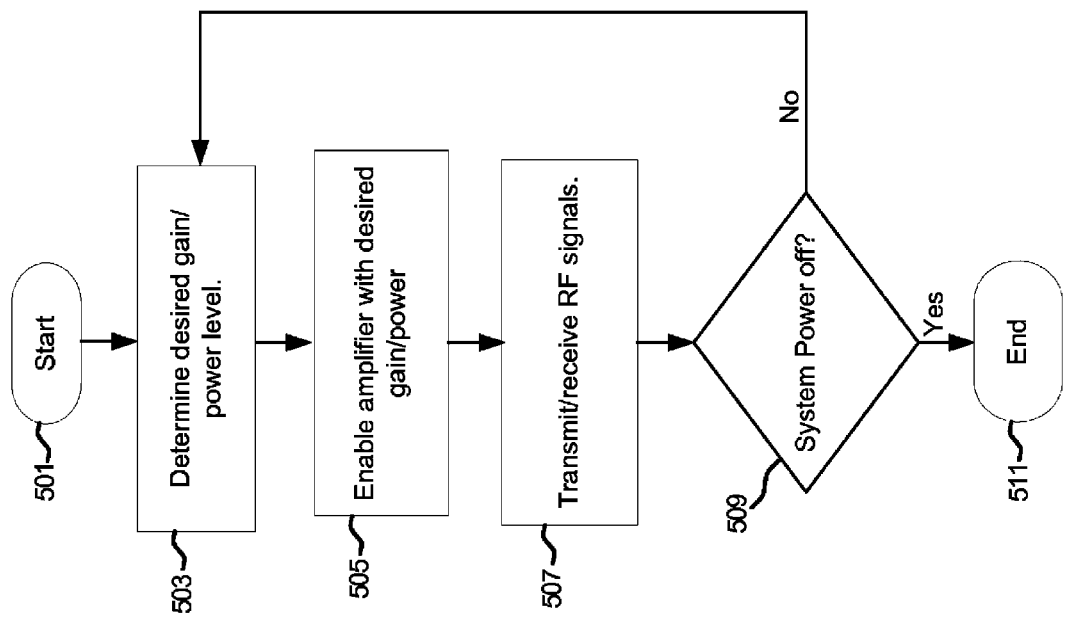
FIG. 5 is a block diagram illustrating exemplary steps for implementing an on-chip multi-tap transformer for impedance matching, in accordance with an embodiment of the invention.

FIG. 5 is a block diagram illustrating exemplary steps for implementing an on-chip multi-tap transformer for impedance matching, in accordance with an embodiment of the invention. Referring to FIG. 5, in step 503 after start step 501, the desired gain or output power level may be determined by a processor such as the processor 155 and/or the baseband processor 154. In step 505, an appropriate amplifier with the desired gain or output power may be enabled. In this regard, one or more of the amplifiers coupled to taps on the multi-tap transformer 165 may be selected and enabled such that the impedances of the amplifiers are matched to the taps on the multi-tap transformer 165. In step 507, the RF signals may be transmitted and/or received by the antenna 164. If, in step 509, the wireless device 150 is to be powered down, the exemplary steps may proceed to end step 511, but if the wireless device 150 is not to be powered down, the exemplary steps may proceed back to step 503 to continue the RF signal communication.

In an embodiment of the invention, a method and system are disclosed for selectively enabling one or more amplifiers 203A-203C coupled to taps A+, A−, B+, B−, C+, and C− on a multi-tap transformer 165 in a chip 162 comprising the amplifiers 203A-203C and/or 205A-205C. During the selective enabling of the amplifiers, one or more of the amplifiers 203A-203C and/or 205A-205C may be active and one or more of the amplifiers 203A-203C and/or 205A-205C may be inactive. The impedances of the amplifiers 203A-203C and/or 205A-205C may be matched to impedances of the taps A+, A−, B+, B−, C+, and C− on the multi-tap transformer 165. The amplifiers may comprise low noise amplifiers 205A-205C wherein the input impedance of each of the low noise amplifiers 205A-205C may be different. The amplifiers may comprise power amplifiers 203A-203C wherein an output impedance of each of the power amplifiers 203A-203C may be different. The transformer 165 may be coupled to an on-chip antenna 164, or to an antenna integrated on a package 167 coupled to the chip 162. The multi-tap transformer 165 may be integrated on the package 167. RF signals may be communicated via the selectively enabled amplifiers 203A-203C and/or 205A-205C and the multi-tap transformer 165. The multi-tap transformer 165 may comprise ferromagnetic materials integrated in the chip 162.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for on-chip impedance control to impedance match a configurable front end.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for enabling communication, the method comprising:
   in a chip comprising a plurality of amplifiers and a multi-tap transformer integrated on a single substrate:
      selectively enabling one or more of said plurality of amplifiers; and
      adjusting a gain of said one or more of said plurality of amplifiers that are enabled, wherein:
         each of said plurality of amplifiers is coupled to one of different pairs of taps on said multi-tap transformer;
         each of said different pairs of taps have at least one primary winding of said multi-tap transformer in common;
         an impedance of each of said plurality of amplifiers is matched to an impedance of said corresponding pair of taps on said multi-tap transformer.

2. The method according to claim 1, wherein said plurality of amplifiers comprise two or more power amplifiers.

3. The method according to claim 2, wherein an output impedance of each of said two or more power amplifiers is different.

4. The method according to claim 1, wherein said multi-tap transformer is coupled to an on-chip antenna.

5. The method according to claim 1, wherein said multi-tap transformer is coupled to an antenna integrated on a package coupled to said chip.

6. The method according to claim 5, wherein said multi-tap transformer is integrated on said package.

7. The method according to claim 1, comprising communicating RF signals via said selectively enabled amplifiers and said multi-tap transformer.

8. A system for enabling communication, the system comprising:
   one or more circuits on a chip integrated on a single substrate, said one or more circuits comprising a plurality of amplifiers and a multi-tap transformer;
   said one or more circuits are configured to:
      selectively enable one or more of said plurality of amplifiers; and
      adjust a gain of said one or more of said plurality of amplifiers that are enabled, wherein:
         each of said plurality of amplifiers is coupled to one of different pairs of taps on said multi-tap transformer;
         each of said different pairs of taps have at least one primary winding of said multi-tap transformer in common;
         an impedance of each of said plurality of amplifiers is matched to an impedance of said corresponding pair of taps on said multi-tap transformer.

9. The system according to claim 8, wherein said plurality of amplifiers comprise two or more power amplifiers.

10. The system according to claim 9, wherein an output impedance of each of said two or more power amplifiers is different.

11. The system according to claim 8, wherein said multi-tap transformer is coupled to an on-chip antenna.

12. The system according to claim 8, wherein said multi-tap transformer is coupled to an antenna integrated on a package coupled to said chip.

13. The system according to claim 12, wherein said multi-tap transformer is integrated on said package.

14. The system according to claim 8, wherein said one or more circuits are operable to communicate RF signals via said selectively enabled amplifiers and said multi-tap transformer.

15. The system according to claim 8, wherein said multi-tap transformer comprises ferromagnetic materials integrated in said chip.

16. A communication system comprising:
- a multi-tap transformer comprising a first pair of taps and a second pair of taps, wherein said first pair of taps and said second pair of taps have at least one primary winding of said multi-tap transformer in common;
- a first amplifier coupled to said first pair of taps, wherein an impedance of said first amplifier is matched to an impedance of said first pair of taps;
- a second amplifier coupled to said second pair of taps, wherein an impedance of said second amplifier is matched to an impedance of said second pair of taps; and
- a circuit configured to:
    - selectively enable one or both of said first amplifier and said second amplifier to communicate RF signals; and
    - adjust a gain of said one or both of said first amplifier and said second amplifier that are enabled.

* * * * *